US009852986B1

(12) United States Patent
Stephens et al.

(10) Patent No.: US 9,852,986 B1
(45) Date of Patent: Dec. 26, 2017

(54) METHOD OF PATTERNING PILLARS TO FORM VARIABLE CONTINUITY CUTS IN INTERCONNECTION LINES OF AN INTEGRATED CIRCUIT

(71) Applicant: GLOBALFOUNDRIES Inc., Grand Cayman (KY)

(72) Inventors: Jason Eugene Stephens, Menands, NY (US); Guillaume Bouche, Albany, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/362,035

(22) Filed: Nov. 28, 2016

(51) Int. Cl.
*H01L 21/308* (2006.01)
*H01L 23/528* (2006.01)
*H01L 21/768* (2006.01)

(52) U.S. Cl.
CPC ........ *H01L 23/528* (2013.01); *H01L 21/3081* (2013.01); *H01L 21/3088* (2013.01); *H01L 21/76843* (2013.01); *H01L 21/76892* (2013.01)

(58) Field of Classification Search
CPC .............. H01L 23/528; H01L 21/3081; H01L 21/3088; H01L 21/76843; H01L 21/76842; H01L 21/76892; H01L 21/02068; H01L 21/31144
See application file for complete search history.

(56) References Cited

U.S. PATENT DOCUMENTS

| 6,455,436 | B1 | 9/2002 | Ueda et al. |
| 7,183,142 | B2 | 2/2007 | Anderson et al. |
| 8,298,943 | B1 | 10/2012 | Arnold et al. |
| 8,518,824 | B2 | 8/2013 | Arnold et al. |
| 8,999,848 | B2 | 4/2015 | Lee et al. |
| 9,012,287 | B2 | 4/2015 | Liaw |
| 9,123,656 | B1 | 9/2015 | Hsieh et al. |
| 9,136,106 | B2 | 9/2015 | Wu et al. |
| 9,209,279 | B1 | 12/2015 | Zhang et al. |
| 9,406,775 | B1 | 8/2016 | Bouche et al. |
| 2005/0215040 | A1 | 9/2005 | Doyle |
| 2006/0055045 | A1 | 3/2006 | Park et al. |

(Continued)

OTHER PUBLICATIONS

U.S. Appl. No. 15/077,384, filed Mar. 22, 2016.

(Continued)

*Primary Examiner* — Nathan W Ha
(74) *Attorney, Agent, or Firm* — Heslin Rothenberg Farley & Mesiti P.C.

(57) ABSTRACT

A method including providing a semiconductor structure having a dielectric stack, hardmask stack, and mandrel layer disposed thereon. An array of mandrels is patterned into the mandrel layer. Mandrel spacers are formed self-aligned on sidewalls of the mandrels. A gapfill layer is disposed and planarized over the semiconductor structure. Non-mandrel pillars are formed over the planarized gapfill layer. Exposed portions of the gapfill layer are etched to form non-mandrel plugs preserved by the pillars. The pillars are removed to form a pattern, the pattern including the non-mandrel plugs. The pattern is utilized to form an array of alternating mandrel and non-mandrel metal interconnection lines in the dielectric stack. The array includes non-mandrel dielectric structures formed from the non-mandrel plugs.

10 Claims, 12 Drawing Sheets

(56) References Cited

U.S. PATENT DOCUMENTS

| | | | |
|---|---|---|---|
| 2008/0193658 A1* | 8/2008 | Millward | B81C 1/00031 427/401 |
| 2008/0227298 A1* | 9/2008 | Hirota | H01L 21/3081 438/693 |
| 2011/0240596 A1* | 10/2011 | Millward | B81C 1/00031 216/41 |
| 2011/0256723 A1* | 10/2011 | Lee | H01L 21/0337 438/694 |
| 2011/0316125 A1* | 12/2011 | Thomas | H01L 21/3065 257/622 |
| 2012/0118854 A1 | 5/2012 | Smayling et al. | |
| 2012/0132988 A1* | 5/2012 | Lui | H01L 29/0638 257/334 |
| 2013/0196517 A1 | 8/2013 | Tsujita et al. | |
| 2013/0244344 A1 | 9/2013 | Malmhall et al. | |
| 2013/0329486 A1 | 12/2013 | Juengling | |
| 2014/0038428 A1 | 2/2014 | Huang et al. | |
| 2014/0054534 A1 | 2/2014 | Pellizzer et al. | |
| 2014/0170853 A1 | 6/2014 | Shamma et al. | |
| 2014/0258961 A1 | 9/2014 | Ke et al. | |
| 2014/0273363 A1 | 9/2014 | Chiu et al. | |
| 2014/0273464 A1 | 9/2014 | Shieh et al. | |
| 2015/0056800 A1 | 2/2015 | Mebarki et al. | |
| 2015/0072527 A1 | 3/2015 | Ng et al. | |
| 2015/0087149 A1 | 3/2015 | He et al. | |
| 2015/0108087 A1 | 4/2015 | Somervell et al. | |
| 2015/0140811 A1 | 5/2015 | Huang et al. | |
| 2015/0147882 A1 | 5/2015 | Yao et al. | |
| 2015/0179652 A1 | 6/2015 | Wang et al. | |
| 2015/0243654 A1 | 8/2015 | Zhong et al. | |
| 2015/0318173 A1 | 11/2015 | Shih et al. | |
| 2015/0339422 A1 | 11/2015 | Greco et al. | |
| 2016/0049307 A1 | 2/2016 | Chen | |
| 2016/0056075 A1 | 2/2016 | Wei et al. | |
| 2016/0056104 A1 | 2/2016 | Bouche et al. | |
| 2016/0064248 A1 | 3/2016 | Lee et al. | |
| 2016/0086841 A1 | 3/2016 | Song et al. | |
| 2016/0099178 A1 | 4/2016 | Zhana et al. | |
| 2016/0225634 A1 | 8/2016 | Anderson et al. | |
| 2016/0254191 A1 | 9/2016 | Tseng et al. | |
| 2017/0221702 A1 | 8/2017 | Lee et al. | |

OTHER PUBLICATIONS

U.S. Appl. No. 15/271,475, filed Sep. 21, 2016.
U.S. Appl. No. 15/271,497, filed Sep. 21, 2016.
U.S. Appl. No. 15/141,087, filed Apr. 28, 2016.
U.S. Appl. No. 15/379,605, filed Dec. 15, 2016.
U.S. Appl. No. 15/379,645, filed Dec. 15, 2016.
U.S. Appl. No. 15/379,707, filed Dec. 15, 2016.
U.S. Appl. No. 15/379,740, filed Dec. 15, 2016.
U.S. Appl. No. 15/271,519, filed Sep. 21, 2016.
U.S. Appl. No. 15/053,818, filed Feb. 25, 2016.
U.S. Appl. No. 15/077,480, filed Mar. 22, 2016.
U.S. Appl. No. 15/077,564, filed Mar. 22, 2016.

* cited by examiner

METHOD OF PATTERNING PILLARS TO FORM VARIABLE CONTINUITY CUTS IN INTERCONNECTION LINES OF AN INTEGRATED CIRCUIT

TECHNICAL FIELD

The present invention relates to semiconductor devices and methods of fabricating the same. More specifically, the invention relates to various methods of patterning pillars to form variable continuity cuts in non-mandrel lines of a semiconductor structure for an integrated circuit.

BACKGROUND

Advanced lithographic processes, such as self-aligned double patterning (SADP) or self-aligned quadruple patterning (SAQP), are currently used in ultra-high density integrated circuits to provide an electrical interconnection system which includes multiple arrays of parallel mandrel and non-mandrel metal lines disposed in several levels of dielectric layers. The dielectric layers are typically interconnected through a system of metalized vias. Conventionally, within an array of metal lines, the direction longitudinal, or parallel, to the metal lines is designated the "Y" direction and the direction perpendicular, or lateral, to the metal lines is designated the "X" direction.

In order to provide functionality between devices, such as transistors, capacitors and the like, in the integrated circuit, a plurality of continuity cuts (also referred to as continuity blocks) must be lithographically patterned into the metal lines at specific locations to direct current flow between the dielectric layers and the devices. Problematically however, lithographic misalignment is a significant issue at lower technology node sizes, such as when the repetitive pitch distance between metal lines is no greater than 40 nanometers (nm). Lithographic misalignment is a measure of how well two lithographic layers (or steps) align.

The lithographically disposed continuity cuts must be large enough to make sure that they cut the metal lines they are supposed to without clipping any neighboring lines, taking into account worst case tolerance conditions. However, this becomes increasingly problematic as the metal line pitch on an interconnection system becomes increasingly smaller, for example smaller than 40 nm. The unwanted over-extension of continuity cuts into neighboring lines can, in the worst case condition, completely interrupt electrical continuity in the wrong line.

Additionally, continuity cuts can vary drastically in size within an array of metal lines disposed in a dielectric layer of an integrated circuit. For example, there may be small cuts (e.g., about the width of a single metal line or a single minimum pitch length) required to block continuity, and there may also be large cuts (e.g., several pitch lengths in width) which are used to define a transition region from multiple minimum width metal lines to a much larger width single metal line. Additionally, the largest cuts of all are often used to define an ANA region bordering the metal line array in which no metal lines or active devices can exist. This variability in the size of continuity cuts is very difficult to achieve with prior art lithographic techniques.

Moreover for smaller pitches, for example pitches of 40 nm or less, it becomes increasingly problematic for prior art lithographic processes to cut (or block the formation of) a dummy (or inactive) metal line from between two active metal lines in an array of metal lines. Often times in an interconnection system, not all of the metal lines will be active. Due to conventional lithographic limitations, these dummy lines are typically left disposed in the dielectric layer between active lines. Problematically however, the dummy lines increase the parasitic capacitance between the active lines and, as such, degrade performance.

Accordingly, there is a need for a method of more precisely and easily forming variable continuity cuts in arrays of metal lines of an integrated circuit than that of the prior art. More specifically, there is a need for a method of forming cuts in arrays of metal lines of an integrated circuit that can be utilized to provide such functions as:

forming continuity blocks within a single line,
 defining transition regions between multiple lines,
 defining relatively large ANA regions bordering the array of lines,
 blocking the formation of dummy lines from between active lines, or
 other similar functions.

BRIEF DESCRIPTION

The present invention offers advantages and alternatives over the prior art by providing an apparatus and method of making an array of mandrel and non-mandrel metal interconnection lines in a semiconductor structure for an integrated circuit. The method and apparatus can form continuity blocks within a single line, define transition regions between multiple lines, define relatively large ANA regions bordering the array of lines and block the formation of dummy lines from between active lines.

A method in accordance with one or more aspects of the present invention includes providing a semiconductor structure having a dielectric stack, hardmask stack, and mandrel layer disposed thereon. An array of mandrels is patterned into the mandrel layer. Mandrel spacers are formed self-aligned on sidewalls of the mandrels. A gapfill layer is disposed and planarized over the semiconductor structure. Non-mandrel pillars are formed over the planarized gapfill layer. Exposed portions of the gapfill layer are etched to form non-mandrel plugs preserved by the pillars. The pillars are removed to form a pattern, the pattern including the non-mandrel plugs. The pattern is utilized to form an array of alternating mandrel and non-mandrel metal interconnection lines in the dielectric stack. The array includes non-mandrel dielectric structures formed from the non-mandrel plugs.

In another embodiment of the present invention a method includes providing a semiconductor structure having a dielectric stack, hardmask stack, and mandrel layer disposed thereon. An array of mandrels is patterned into the mandrel layer. A gapfill layer is disposed and planarized over the semiconductor structure. Non-mandrel pillars are formed over the planarized gapfill layer. Exposed portions of the gapfill layer are etched to form non-mandrel plugs preserved by the pillars. The non-mandrel plugs include a non-mandrel line plug. The pillars are removed to form a pattern. The pattern includes the non-mandrel plugs. The pattern is utilized to form an array of alternating mandrel and non-mandrel metal interconnection lines in the dielectric stack. The array includes a non-mandrel dielectric line region formed from the non-mandrel line plug. The non-mandrel dielectric line region is disposed between, and self-aligned with, two adjacent mandrel metal lines of the pattern.

A semiconductor structure in accordance with one or more aspects of the present invention includes an ultra-low k (ULK) dielectric layer. An array of metal lines is disposed within the ULK layer. The array includes alternating mandrel and non-mandrel metal lines having a minimum metal line width. The array also includes dielectric line spacers having a minimum dielectric spacer width disposed between the mandrel and non-mandrel lines. The array further includes a minimum metal line pitch, which is equal to the minimum metal line width and minimum dielectric spacer width combined. The minimum metal line pitch is 40 nm or less. Additionally the array includes a non-mandrel dielectric line region disposed between two adjacent mandrel metal lines and being self-aligned with the adjacent mandrel metal lines. The non-mandrel dielectric line region has a width that is substantially equal to the minimum metal line width plus two minimum dielectric spacer widths combined. The non-mandrel dielectric line region has a length that is greater than or equal to 10 minimum metal line pitches.

DRAWINGS

The invention will be more fully understood from the following detailed description taken in conjunction with the accompanying drawings, in which.

DETAILED DESCRIPTION

Certain exemplary embodiments will now be described to provide an overall understanding of the principles of the structure, function, manufacture, and use of the methods, systems, and devices disclosed herein. One or more examples of these embodiments are illustrated in the accompanying drawings. Those skilled in the art will understand that the methods, systems, and devices specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention.

FIGS. 1-18 illustrate various exemplary embodiments of methods of patterning pillars to form variable continuity cuts in an array of metal interconnection lines of an integrated circuit in accordance with the present invention. The method can provide variable cuts which form continuity blocks within a single line, define transition regions between multiple lines, define relatively large ANA regions bordering an array of lines, block the formation of dummy lines from between active lines, or the like.

Figure 1:
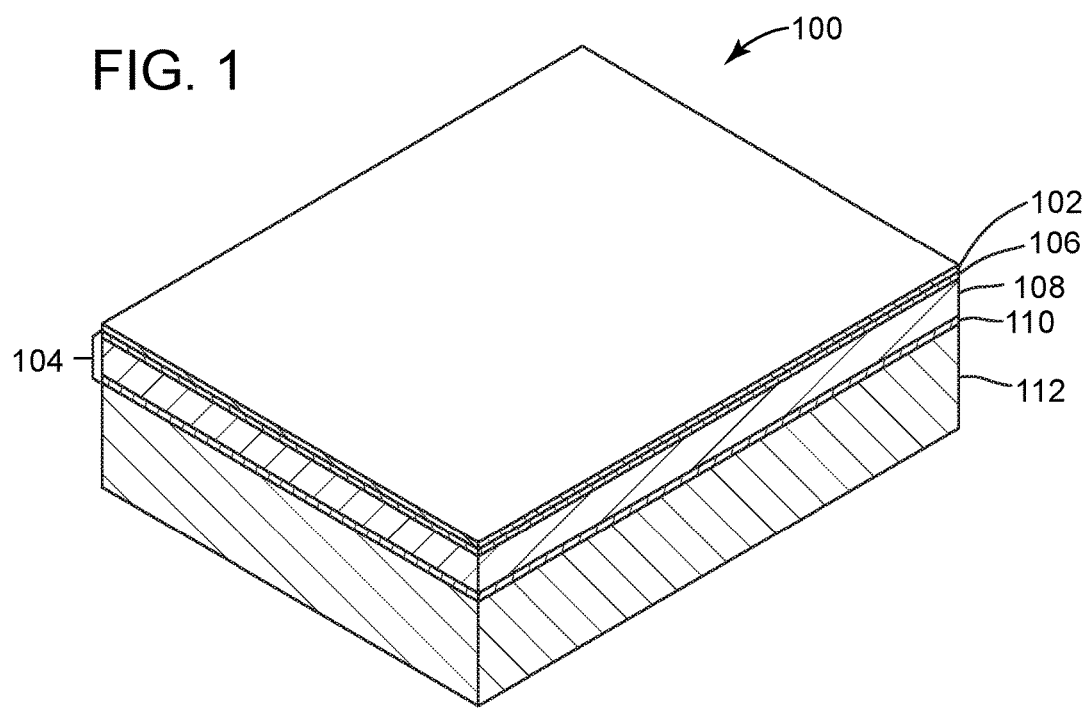
FIG. 1 is simplified perspective view of an exemplary embodiment of a semiconductor structure for an integrated circuit device having a $1^{st}$ hardmask layer of a hardmask stack disposed over an ultra-low k (ULK) layer of a dielectric stack in accordance with the present invention.

Referring to FIG. 1, a simplified view of an exemplary embodiment of a structure 100 for an integrated circuit device in accordance with the present invention is presented at an intermediate stage of manufacturing. Structure 100 includes a titanium nitride (TiN) first ($1^{st}$) hardmask layer 102 disposed over a dielectric stack 104. The dielectric stack 104 may include many different combinations of layers depending on such factors as application requirements, cost, design preferences and the like. In this exemplary embodiment, the dielectric stack 104 includes a silicon oxynitride (SiON) intermediate dielectric layer 106 disposed over an ultra-low k (ULK) dielectric layer 108. It is the ULK layer 108 into which an array 194 of metal lines (best seen in FIG. 18) for an interconnect system of the integrated circuit will be formed later in the process flow. The ULK layer 108 may be composed of various combinations of silicon, carbon, oxygen and hydrogen (SiCOH) or the like. The ULK dielectric layer 108 is disposed over an etch-stop layer 110, such as a silicon nitride (SiN) layer, which is also included in the dielectric stack 104.

The dielectric stack 104 is disposed over a complex stack of buried layers 112. The buried layers may include a stack of layers (not shown) from a front-end-of-the-line substrate layer to middle-of-the-line contact layers to back-end-of-the-line metalized layers and upwards.

Figure 2:
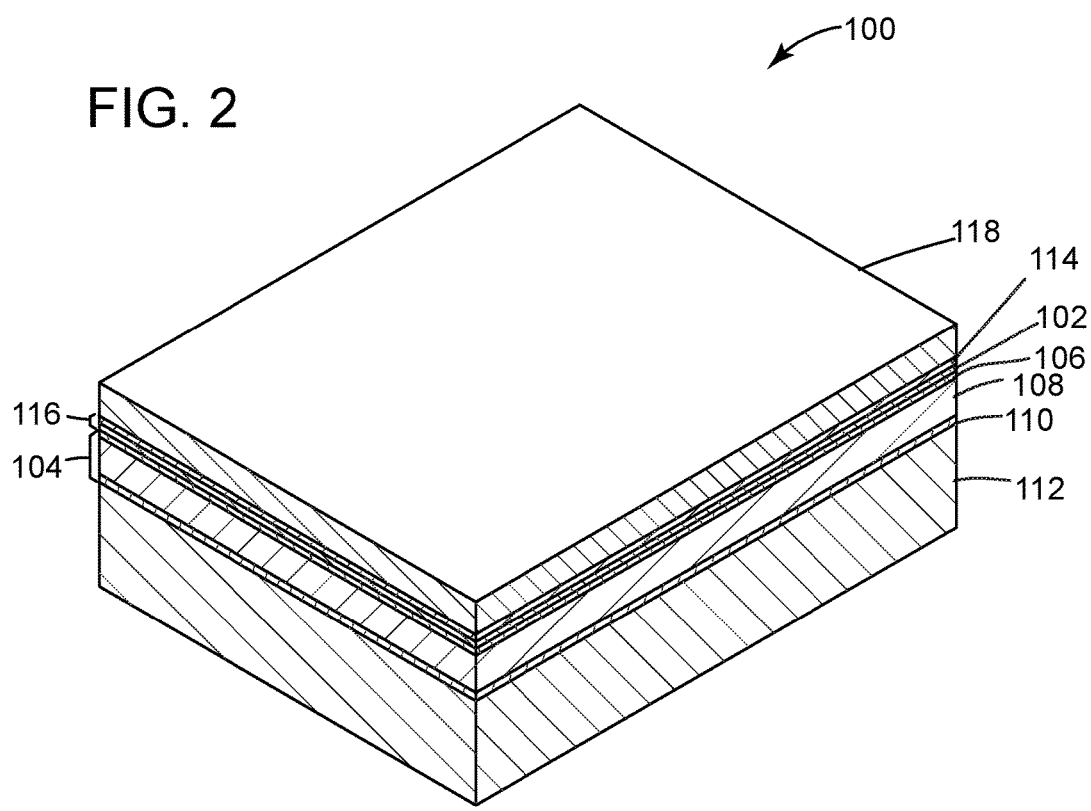
FIG. 2 is a perspective view of FIG. 1 having a $2^{nd}$ hardmask layer and a mandrel layer disposed thereon in accordance with the present invention.

Referring to FIG. 2, a second ($2^{nd}$) hardmask layer 114 is disposed over the $1^{st}$ TiN hardmask layer 102 to form a hardmask stack of layers 116. The hardmask stack 116 may include just one layer (such as just the TiN $1^{st}$ hardmask layer alone) or many different combinations of layers depending on such factors as application requirements, cost, design preferences and the like.

In this exemplary embodiment, the $2^{nd}$ hardmask layer 114 functions as an adhesion layer to enhance adhesion between the below $1^{st}$ hardmask layer 102 and a first ($1^{st}$) mandrel layer 118 disposed on top of the $2^{nd}$ hardmask layer 114. The $1^{st}$ mandrel layer 118 may be composed of an amorphous silicon (aSi) or the like. The adhesion layer 114 can be composed of any appropriate hardmask material that would enhance adhesion between the mandrel layer 118 and the $1^{st}$ hardmask layer 102, such as (in this embodiment) SiN.

Figure 3:
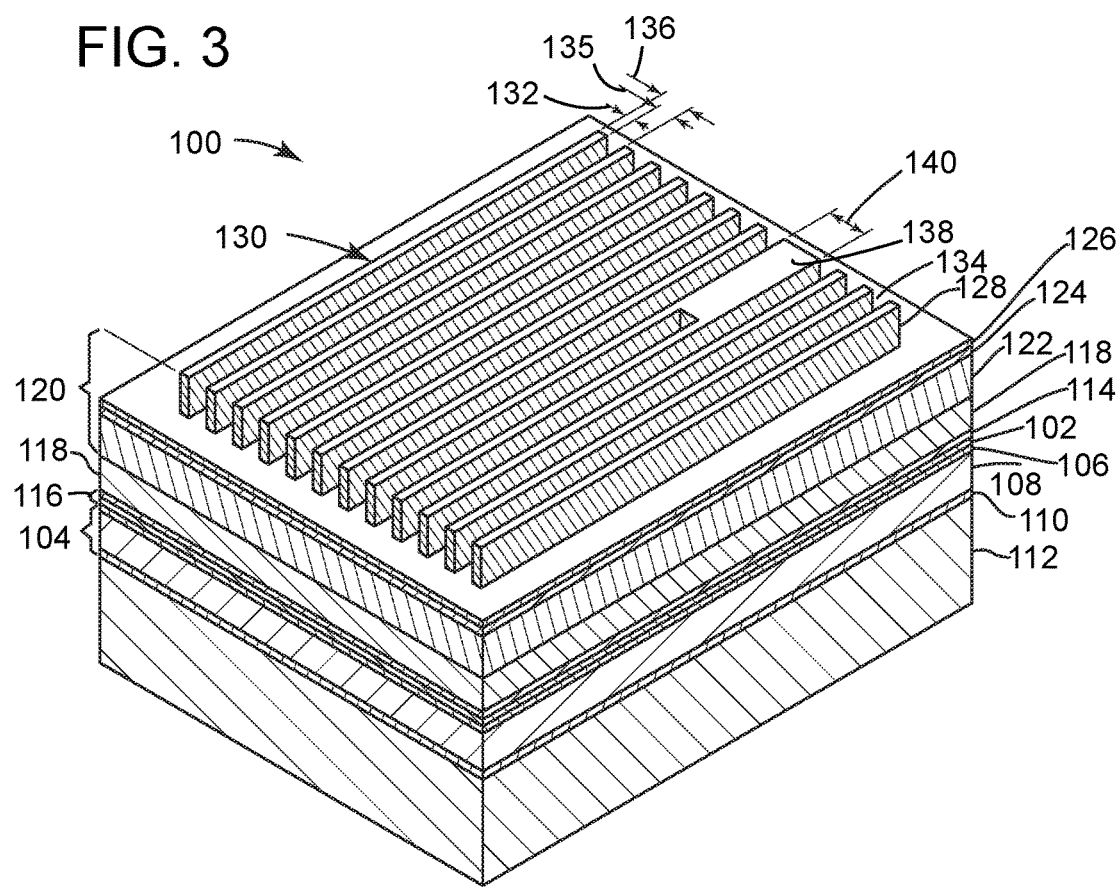
FIG. 3 is a perspective view of FIG. 2 having a $1^{st}$ lithographic stack ($1^{st}$ litho stack) disposed thereon with mandrels patterned into a resist layer of the $1^{st}$ litho stack in accordance with the present invention.

Referring to FIG. 3, a first lithographic stack ($1^{st}$ litho stack) 120 is next disposed onto the mandrel layer 118. The $1^{st}$ litho stack 120 can be composed of several different kinds of layers, depending on such parameters as the application requirements, design or proprietary preferences or the like. One such stack of layers includes a stack of four thin films which includes (from bottom to top) a first spin-on hardmask layer ($1^{st}$ SOH) layer 122, a first SiON cap layer 124, a first bottom antireflective coating (BARC) layer 126, and a first resist layer 128. The $1^{st}$ SOH layer 122 may be an organic planarization layer (OPL) deposited through a spin-on process and may be composed of an organic material such as amorphous carbon (aC) or similar.

Once the $1^{st}$ litho stack 120 is disposed over the $1^{st}$ mandrel layer 118, an array of the mandrels 130 is patterned into the resist layer 128 through well-known lithographic techniques. The mandrels 130 are formed with a predetermined minimum mandrel width 132. Additionally minimum mandrel spacings 134 between consecutive mandrels 130 are formed with a predetermined minimum mandrel spacing width 135. The minimum mandrel width 132 and minimum mandrel spacing width 135 form the minimum mandrel pitch 136. In this exemplary embodiment, the minimum mandrel width 132 is set at 40 nm, the minimum mandrel spacing width 135 is also set at 40 nm and, therefore, the minimum mandrel pitch 136 is set as 80 nm.

In this specific exemplary embodiment, the mandrels 130 also include a wide mandrel section 138. The wide mandrel section 138 has a wide mandrel section width 140 that is larger than the minimum mandrel width 132 and can be equal to or greater than 2 minimum mandrel pitches. Additionally, the wide mandrel section 138 has a length that is also equal to or greater than 2 minimum mandrel pitches.

Figure 4:
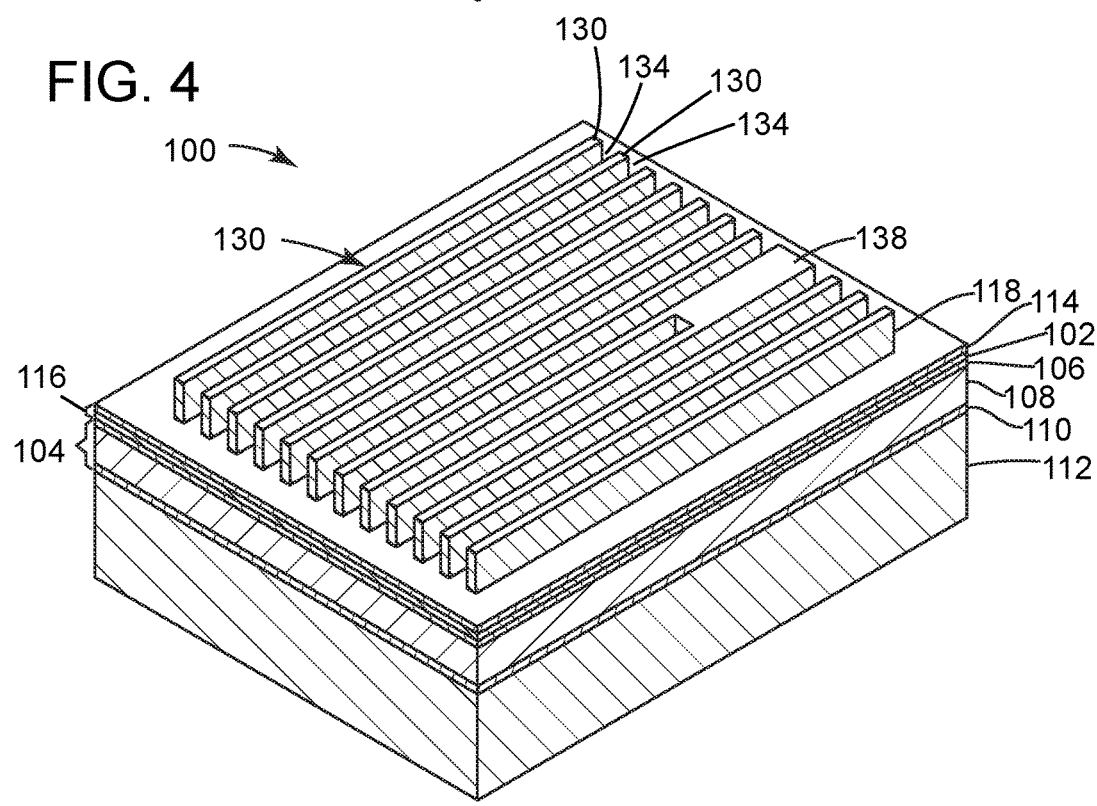
FIG. 4 is a perspective view of FIG. 3 having the mandrels patterned into the mandrel layer in accordance with the present invention.

Referring to FIG. 4, the mandrels 130 are next patterned down to the $1^{st}$ mandrel layer 118. For purposes of clarity, any feature herein, such as a spacer, a trench, an opening, a plug, a mandrel or the like, that is etched down (i.e., formed or patterned) from an original feature will be referred to as such original feature if it has the same form and function as the original feature. However, it is well-known that the etched down feature will be a translation of the original feature and will be composed of remnants of the various layers involved in the etching process. More specifically, in the case of the mandrels 130, the original mandrels 130 were etched into the resist layer 128 and may be composed primarily of material from resist layer 128 (best seen in FIG. 3). However, once the mandrels 130 have been etched down and translated into the $1^{st}$ mandrel layer 118, the mandrels 130 may be composed primarily of the aSi material of the $1^{st}$ mandrel layer 118 (best seen in FIG. 6).

It is important to note that the mandrels 130, including the wide mandrel section 138, will be utilized to form mandrel metal lines 196, 200 (best seen in FIG. 18) in the ULK layer 108 later in the process flow. Also, as will be explained in greater detail herein, the minimum mandrel spacings 134 between consecutive mandrels 130 will be utilized to form non-mandrel lines 198 (best seen in FIG. 18) in the ULK layer 108 later in the process flow. For purposes herein, the term "non-mandrel" shall refer to any structure not formed from a mandrel 130.

Figure 5A:
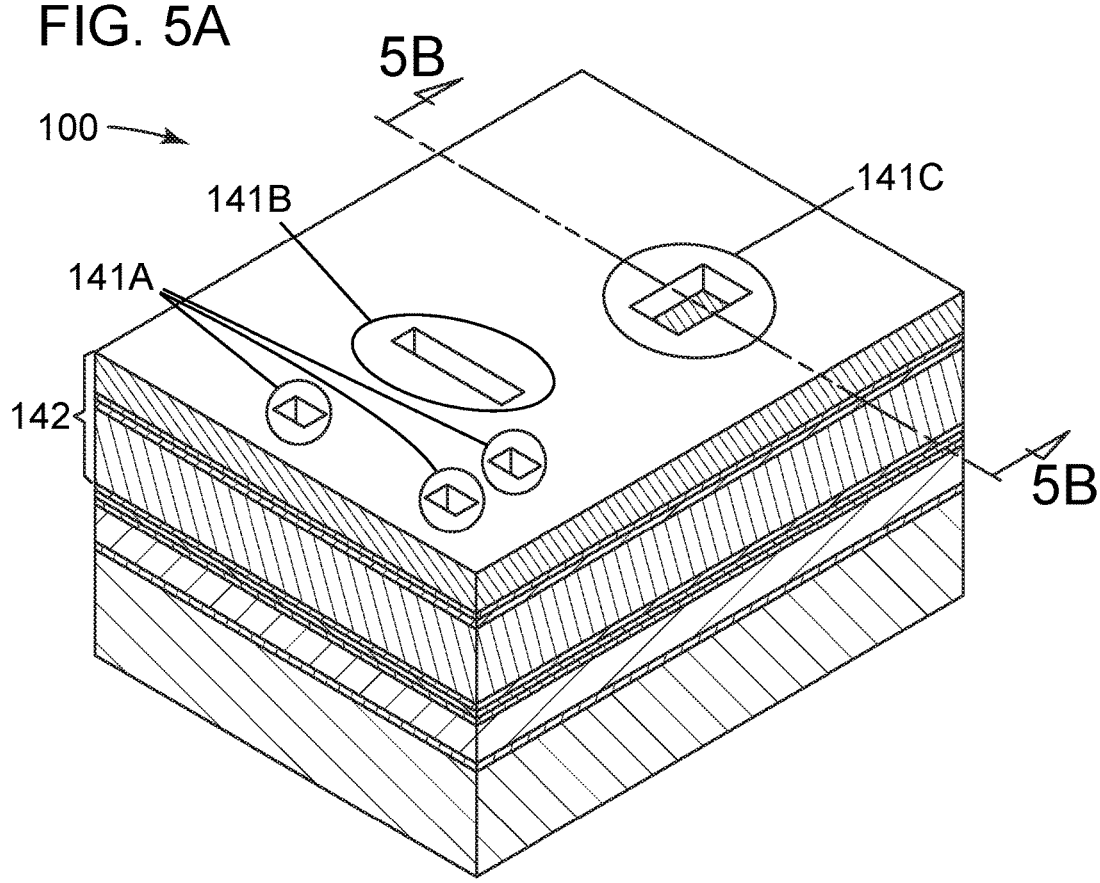
FIG. 5A is a perspective view of FIG. 4 having a $2^{nd}$ litho stack disposed thereon with mandrel openings patterned into a resist layer of the $2^{nd}$ litho stack in accordance with the present invention.
Figure 5B:
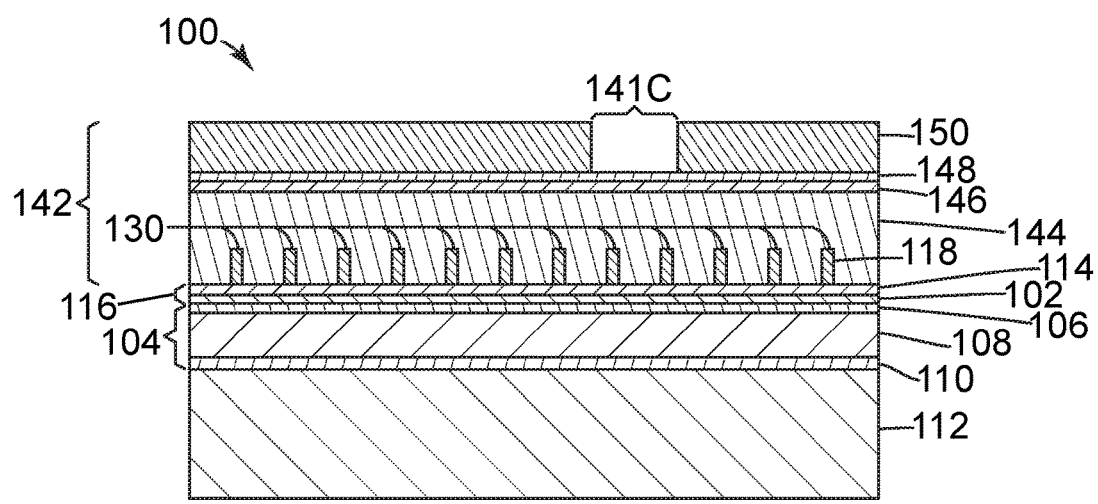
FIG. 5B is a side cross sectional view of FIG. 5A taken along the line 5B-5B in accordance with the present invention.

Referring to FIGS. 5A and 5B, wherein FIG. 5A is a perspective view of the structure of FIG. 4 having a $2^{nd}$ litho stack 142 disposed thereon and FIG. 5B is a cross sectional side view of FIG. 5A taken along the line 5B-5B. A process of patterning mandrel openings 141 into the structure 100 is initiated by next disposing the $2^{nd}$ litho stack 142 over the structure 100. Similar to the $1^{st}$ litho stack 120, the $2^{nd}$ litho stack 142 can be composed of a $2^{nd}$ SOH layer 144, a 2nd SiON cap layer 146, a 2nd BARC layer 148, and a $2^{nd}$ resist layer 150.

The several different sized mandrel openings 141 may then be lithographically patterned into predetermined locations into the $2^{nd}$ resist layer 150 through well know techniques. The mandrel openings 141 may have a variety of widths (in the X direction perpendicular to the mandrels 130) and lengths (in the Y directions parallel to the mandrels 130), and have a variety of functions. In this specific exemplary embodiment, there are three different sized mandrel openings 141A, 141B and 141C, wherein:

Mandrel openings 141A are single cut mandrel openings sized to have the minimum opening length and minimum opening width necessary to provide a single continuity cut through a single mandrel metal line having a minimum mandrel line width, which will be formed within the ULK layer 108 at the end of the process flow. Note that in this exemplary embodiment, the minimum length of mandrel openings 141A is set at 20 nm. Additionally, the minimum width of the mandrel openings 141A is also set at 20 nm, which will be equal to the width of the single mandrel metal lines that will be formed later in the process flow.

Mandrel opening 141B is a multiple cut mandrel opening having a minimum opening length of 20 nm but having a width that is larger than the minimum opening width. In this case the width of the mandrel opening 141B is at least three times the original mandrel pitch 136 of 80 nm or at least 240 nm long. The width of mandrel opening 141B is sized to provide a plurality of single continuity cuts through several single mandrel metal lines, wherein the continuity cuts are aligned in the X direction.

Mandrel opening 141C is a transition region opening sized to provide a relatively larger opening than the minimum length and minimum width of the mandrel openings 141A. Preferably, the transition region opening has a width and a length that are at least equal to two minimum mandrel pitches. The transition region 141C opening is disposed between, and adjacent to, the wide mandrel section 138 and at least two minimum width mandrels 130.

For purposes herein, the different types of mandrel openings 141A, B and C will be collectively referred to as mandrel openings 141.

Figure 6:
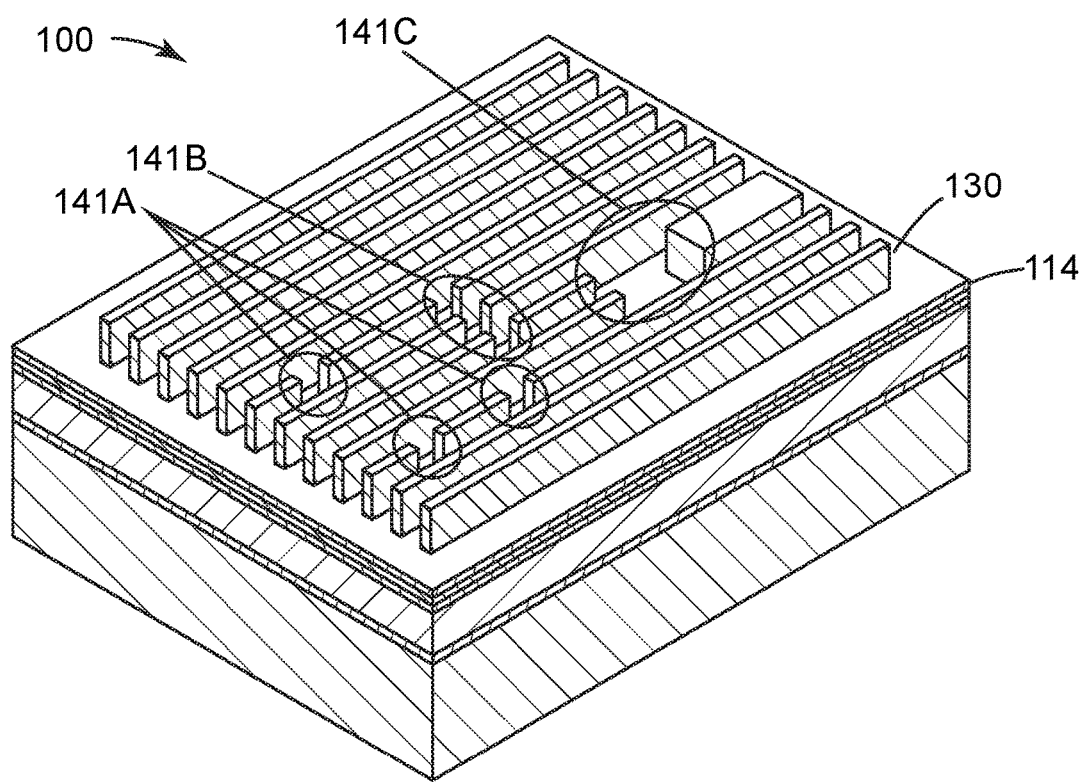
FIG. 6 is a perspective view of FIG. 5A having the mandrel openings etched down into the mandrels in accordance with the present invention.

Referring to FIG. 6, the various mandrel openings 141A, B and C are next etched down into the aSi mandrels 130 on top of the $2^{nd}$ hardmask layer 114. As can be seen, the three mandrel openings 141A are now disposed in the mandrels 130 as three openings 141A extending across a plurality of minimum width mandrel lines 130. Additionally, the mandrel opening 141B is now disposed in the mandrels 130 as a series of three openings 141B aligned in the X direction through three single minimum width mandrel lines 130. The mandrel opening 141C is now disposed between a plurality of minimum width mandrels 130 and the wide mandrel section 138.

Figure 7:
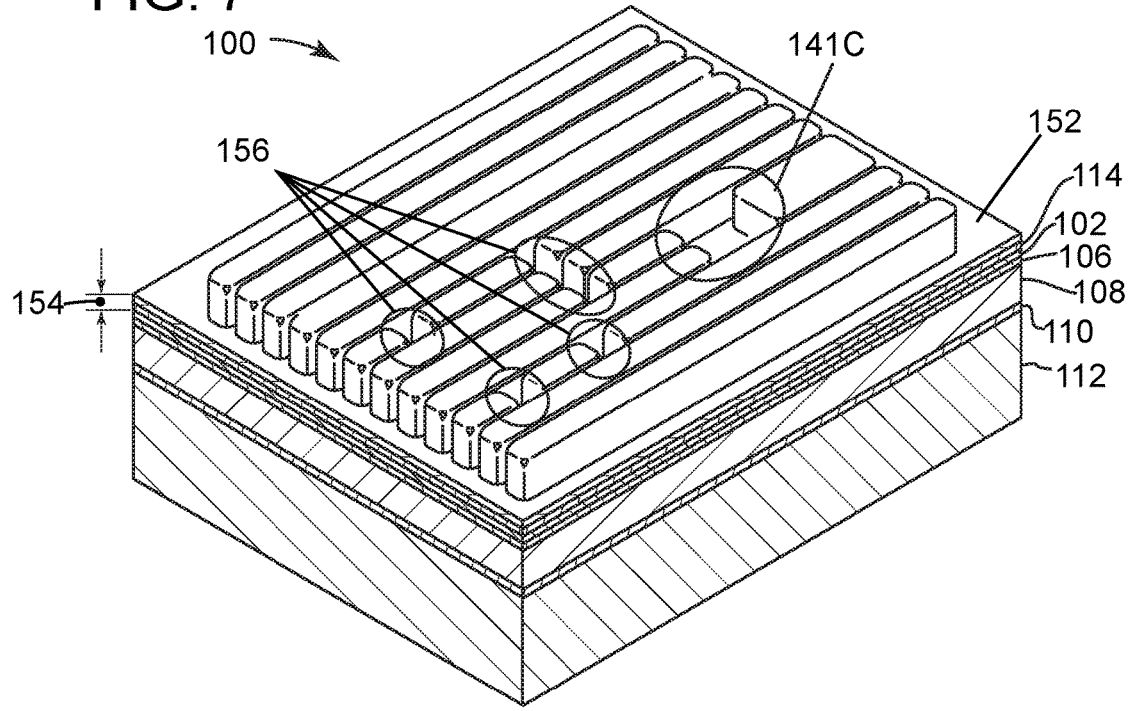
FIG. 7 is a perspective view of FIG. 6 having a spacer layer disposed thereon in accordance with the present invention.

Referring to FIG. 7, a perspective view of FIG. 6 having a spacer layer 152 dispose thereon is presented. The spacer layer 152 has a predetermined spacer layer thickness 154 and is conformally coated over the mandrels 130. In this embodiment, the spacer layer thickness 154 is set at 20 nm plus or minus 2 nm thick. The spacer layer 152 may be coated over the mandrels 130 by an atomic layer deposition process which has very precise control of the spacer layer thickness 154.

The spacer layer may be composed of an oxide layer such as silicon oxide (SiO2) or titanium oxide (TiO2). As will be discussed in greater detail herein, the TiO2 may be very beneficial with regards to material selectivity during etching processes later in the process flow.

It is important to note that the thickness 154 of the spacer layer is equal to or greater than half the minimum opening length in the Y direction of the mandrel openings 141A and 141B of spacer layer 152. More specifically, for this embodiment, the minimum opening length of 20 nm is less than twice the thickness 154 of 20 nm plus or minus 2 nm of spacer layer 152. As such, the spacer layer 152 has filled the openings 141A and B to form mandrel cut plugs 156. In contrast, the larger transition region opening 141C cannot be filled by deposition of the spacer layer 152 and no plug is formed therein.

Figure 8:
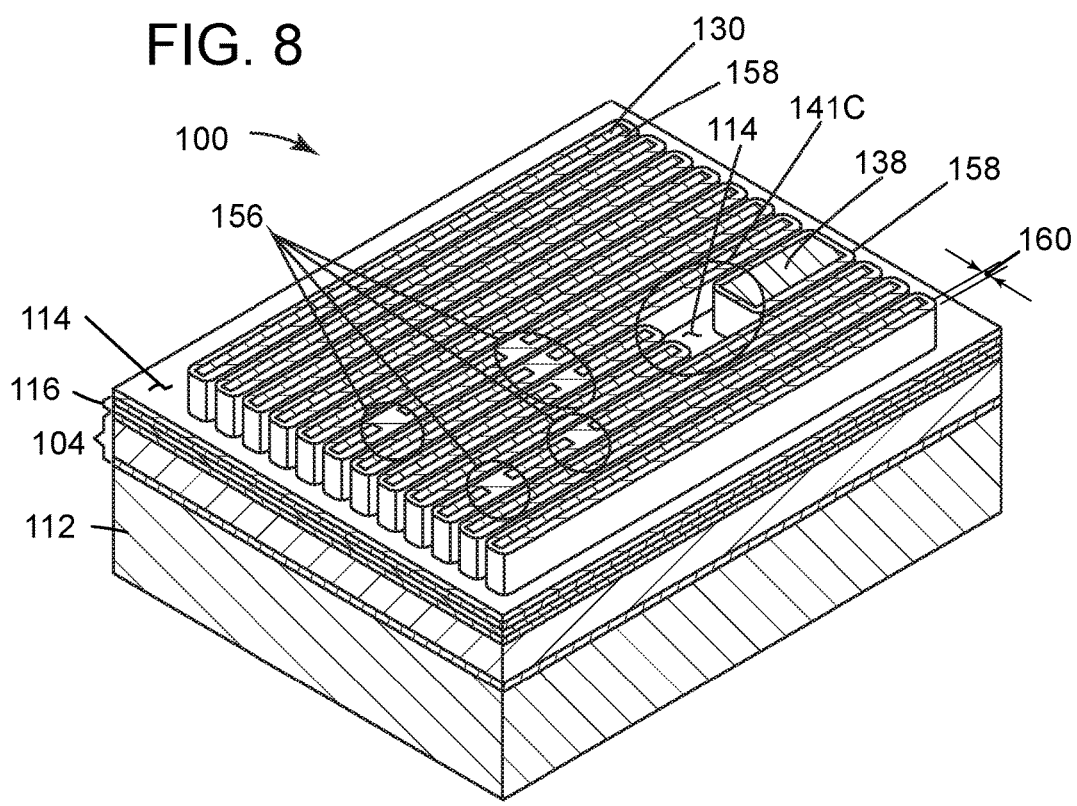
FIG. 8 is a perspective view of FIG. 7 having the spacer layer etched to form spacers on sidewalls of the mandrels in accordance with the present invention.

Referring to FIG. 8, the spacer layer 152 is anisotropically etched to form mandrel spacers 158, which are self-aligned on sidewalls of the mandrels 144. The mandrel spacers 158 have a spacer width 160 that is equal to the spacer layer thickness 154 of approximately 20 nm. Note that with the mandrel spacers 158 in place, the mandrel cut plugs 156 are effectively self-aligned with the sidewalls of the mandrels 130.

Additionally, since there are two spacers for every mandrel, the spacer pitch is now half that of the original mandrel pitch 136. More specifically, the original mandrel pitch for this embodiment is set at 80 nm and the spacer pitch is set at 40 nm.

The anisotropic etching process may be a reactive ion etching (RIE) process or similar. In addition to forming the mandrel spacers 158, the etching process has exposed the tops of the mandrels 130. Additionally, the etching process has exposed the $2^{nd}$ hardmask layer at the bottom of the large area transition region opening 141C and the even larger area bordering the array of mandrels 130.

Figure 9:
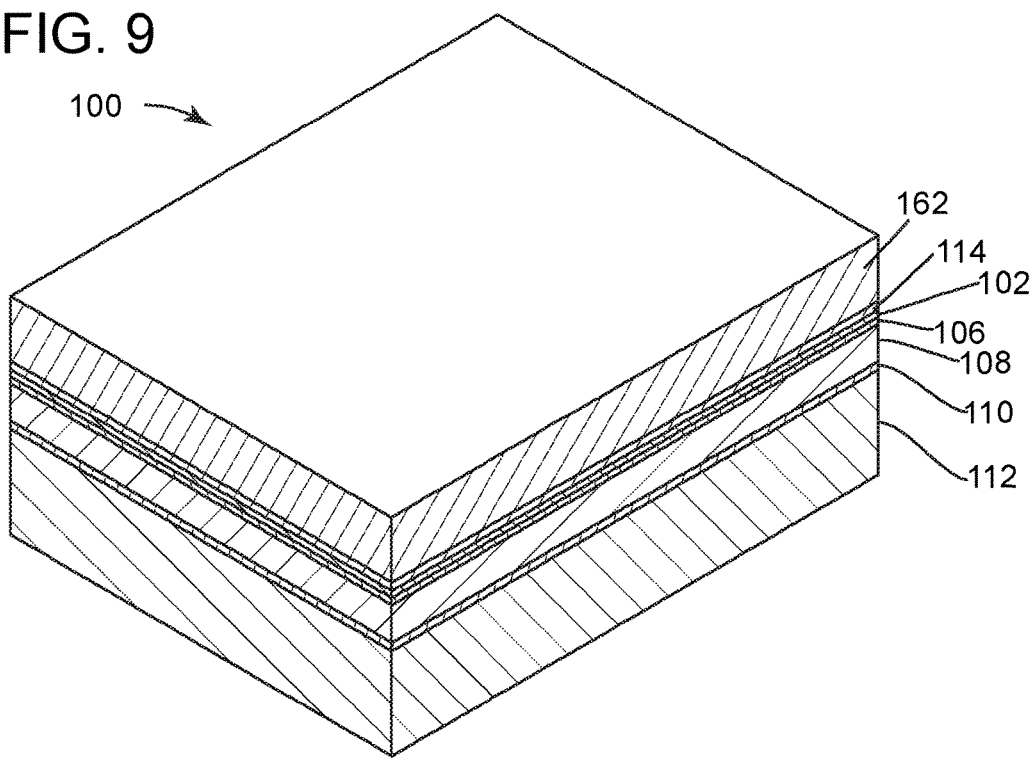
FIG. 9 is a perspective view of FIG. 8 having a gapfill layer disposed thereon in accordance with the present invention.

Referring to FIG. 9, next a gapfill layer 162 is disposed over the entire structure 100. The gapfill layer 162 may be deposited using a spin-on deposition process.

It is desirable that the gapfill layer 162 have certain properties. For example, the gapfill layer 162 should have good "gap-fill" properties so that it can fill trenches with aspect ratios of 3 or greater. Additionally, the gapfill layer 152 should be self planarizing and/or planarize well. Also the gapfill layer should be composed of a material that is easily etched selective relative to the material in the spacers 158 (in this example SiO2 or TiO2), the material of the mandrels 130 (in this example an amorphous silicon (aSi)). To meet these properties, the gapfill layer 152 should be composed of an organic material such as a resist material, or amorphous carbon or similar. Examples of preferred materials include a spin-on oxide if the mandrel spacers 158 were composed of TiO2.

Figure 10:
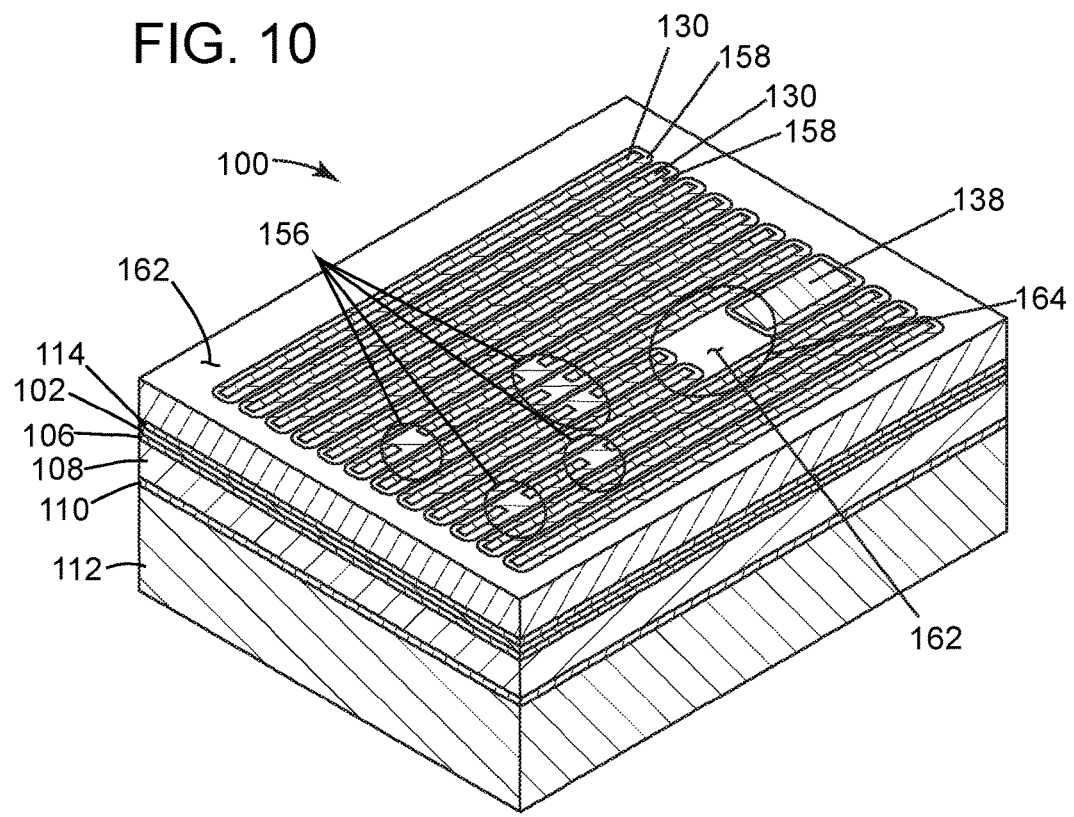
FIG. 10 is a perspective view of FIG. 9 having the gapfill layer planarized down to expose the tops of the mandrels and spacers in accordance with the present invention.

Referring to FIG. 10, the gapfill layer 162 is planarized in a controlled manner, such as with an RIE process, a chemical mechanical polishing (CMP) process, or a combination of both RIE and CMP. The gapfill layer 162 is planarized back such that it fully exposes the tops of the mandrels 130. More preferably, the gapfill layer 162 is etched back such that it is slightly below the top level of the mandrel spacers 158.

It is important to note that the gapfill layer 162 now fills all of the areas there the $2^{nd}$ hardmask layer 114 was exposed prior to the deposition of the gapfill layer. This includes filling the wide transition region opening 141C in order to form a transition region plug 164 later in the process flow. This also includes filling any areas of exposed $2^{nd}$ hardmask layer 114 located between the mandrels 130 and mandrel spacers 158, as well as the large area of exposed $2^{nd}$ hardmask layer 114 bordering the array of mandrels 130.

Figure 11:
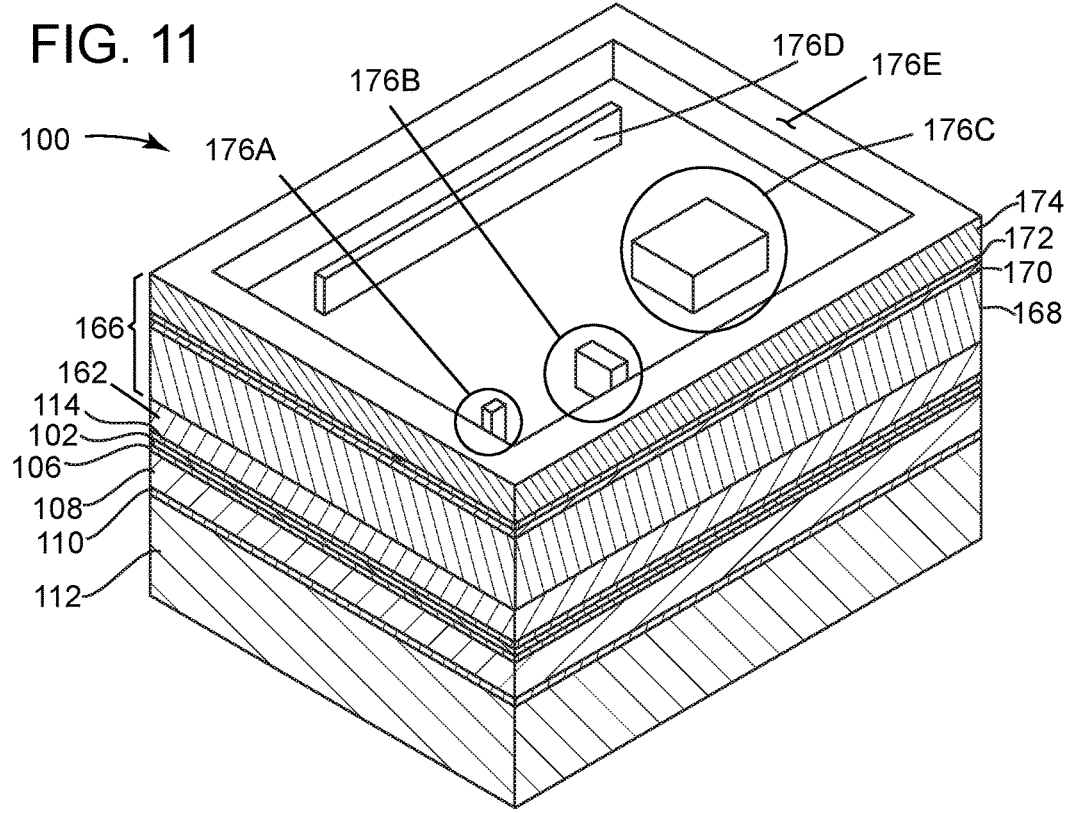
FIG. 11 is a perspective view of FIG. 10 having a $3^{rd}$ litho stack disposed thereon with pillars patterned into a resist layer of the $3^{rd}$ litho stack in accordance with the present invention.

Referring to FIG. 11, next a $3^{rd}$ litho stack 166 is disposed over the structure 100. Similar to the $1^{st}$ litho stack 120, the $2^{nd}$ litho stack 142, the $3^{rd}$ litho stack 166 can be composed of a $3^{rd}$ SOH layer 168, a $3^{rd}$ SiON cap layer 170, a $3^{rd}$ BARC layer 172, and a $3^{rd}$ resist layer 174.

Next, several different sized non-mandrel pillars 176 (collectively) may then be lithographically patterned into predetermined locations into the $3^{rd}$ resist layer 174 through well know techniques. The pillars 176 may have a variety of widths (in the X direction) and lengths (in the Y direction), and will be utilized to form a variety of non-mandrel dielectric structures in the ULK layer 108. In this specific exemplary embodiment, there are five different sized pillars 176A, 176B, 176C, 176D, and 176E wherein:

Pillar 176A is a single cut pillar sized to cover the minimum length and width necessary to form a non-mandrel cut plug which will be utilized to form a single non-mandrel continuity cut through a single non-mandrel metal line having a minimum non-mandrel line width, which will be formed within the ULK layer 108 at the end of the process flow. Note that in this exemplary embodiment, pillar 176A must cover a minimum length of 20 nm and a minimum width of 20 nm. Additionally, the minimum width of 20 nm is equal to the width of the single non-mandrel metal lines that will be formed later in the process flow.

Pillar 176B is a multiple cut pillar having a minimum length of 20 nm but having a width that is larger than the minimum width. In this case the width of the pillar 176B is at least twice the original mandrel pitch 136 of 80 nm or at least 160 nm long. The width of pillar 176B is sized to provide a plurality of single non-mandrel cut plugs which will be utilized to form continuity cuts through several single non-mandrel metal lines, wherein the continuity cuts will be are aligned in the X direction.

Pillar 176C is a non-mandrel transition region pillar sized to form and preserve the non-mandrel transition region plug 164 discussed earlier.

Pillar 176D is a non-mandrel line pillar sized to cover and form a non-mandrel line plug 180 (best seen in FIG. 14), which will be used to prevent the formation of a non-mandrel metal line.

Pillar 176E is a non-mandrel ANA region pillar sized to cover and form a non-mandrel ANA region plug 182 (best seen in FIG. 14), which will be used to form a non-mandrel dielectric ANA region bordering the array of mandrels 130.

For purposes herein, the different types of pillars 176A, B, C, D and E will be collectively referred to as pillars 176.

Figure 12:
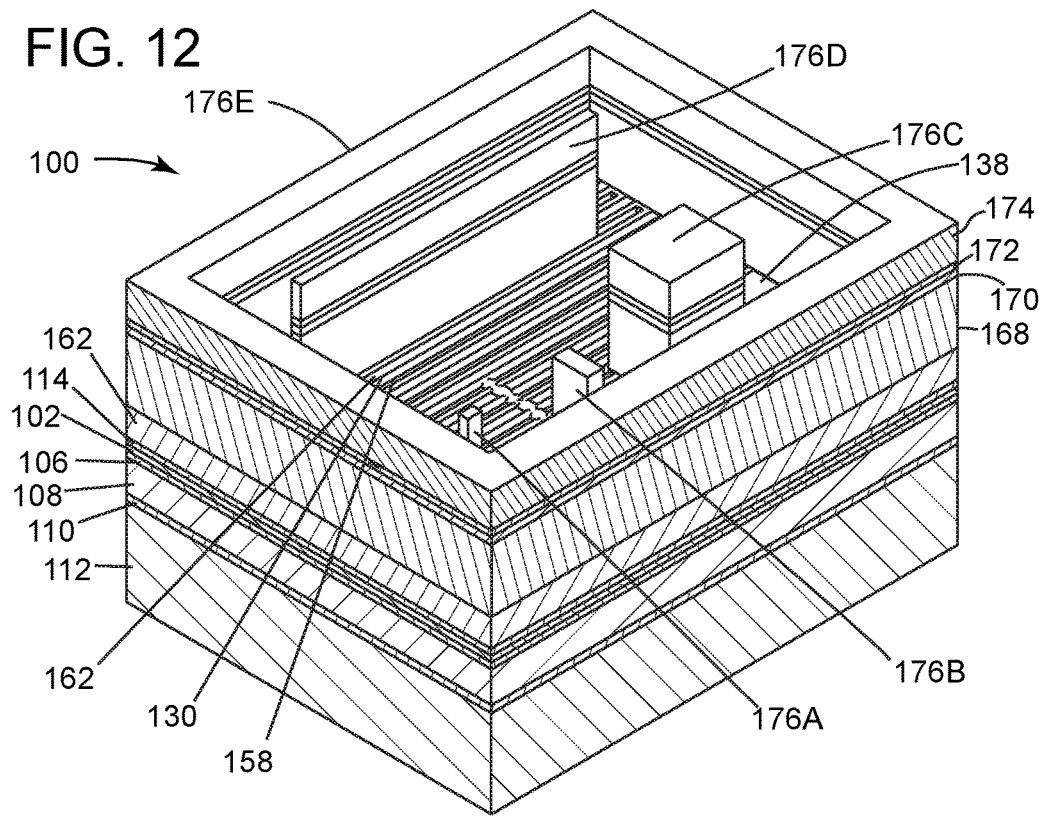
FIG. 12 is a perspective view of FIG. 11 having the pillars etched down to expose the tops of the gapfill layer, mandrels and spacers in accordance with the present invention.

Referring to FIG. 12, the pillars 176 are anisotropically etched down to the bottom of the $3^{rd}$ SOH layer 168 to expose the tops of the mandrels 130 (including the wide mandrel section 138), mandrel spacers 158 and gapfill layer 162. This can be done by a RIE process or similar.

Figure 13:
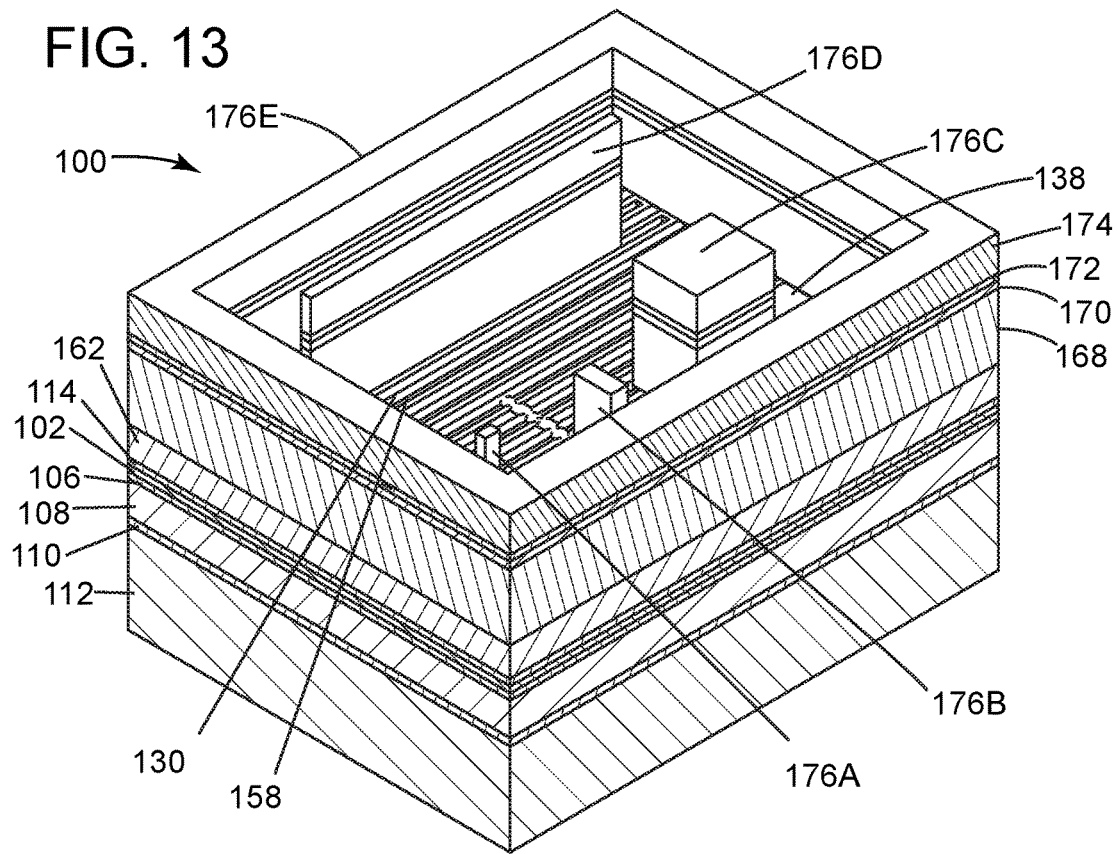
FIG. 13 is a perspective view of FIG. 12 having exposed portions of the gapfill layer, that are not covered by the pillars, etched down to the $2^{nd}$ hardmask layer in accordance with the present invention.

Referring to FIG. 13, next any exposed portions of the gapfill layer 162, that is not covered by pillars 176, is anisotropically etched down to the $2^{nd}$ harmask layer 114. This can also be done by a RIE process or similar, wherein the etch process is selective to the mandrel 130 and mandrel spacer 158 materials.

Figure 14:
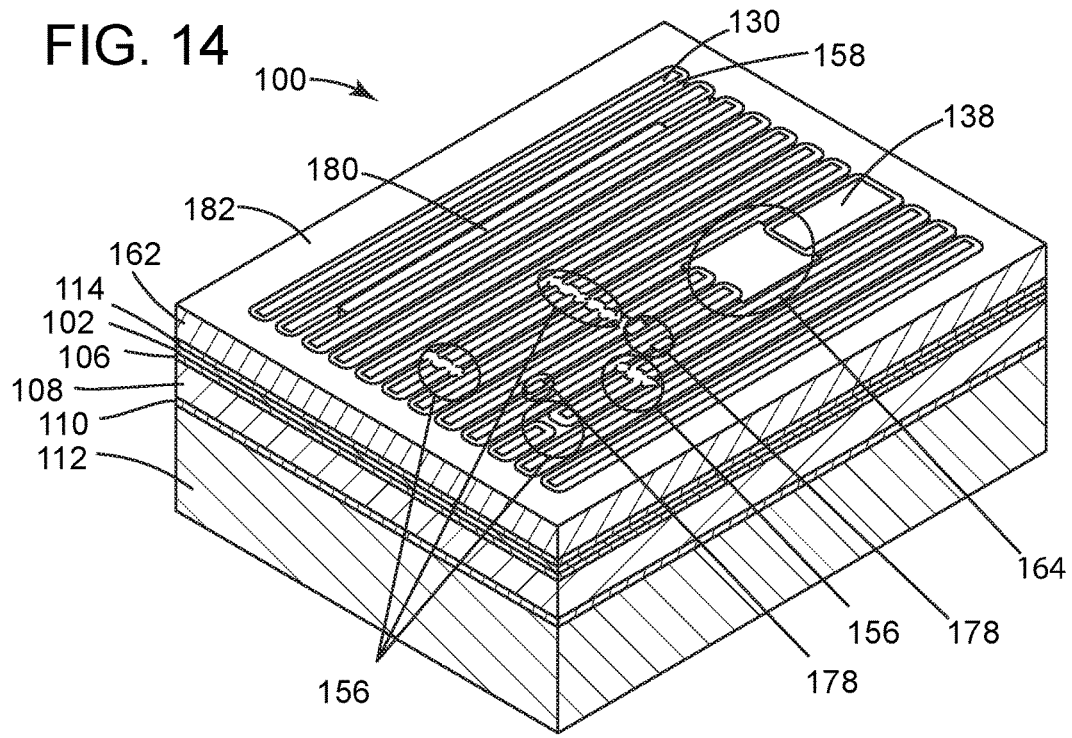
FIG. 14 is a perspective view of FIG. 13 having the pillars removed to form non-mandrel plugs in accordance with the present invention.

Referring to FIG. 14, next the pillars 176 are removed. This may be done using a wet etch, dry etch, ashing process or similar.

As can be seen, the preserved portions of gapfill layer 162, which were covered by pillars, form a variety of non-mandrel plugs. More specifically, pillars 176A and 176B, now have form non-mandrel cut plugs 178, which will be used to form minimum sized non-mandrel continuity cuts 212 in non-mandrel metal lines 198 (best seen in FIG. 18).

Additionally, pillar 176C now has formed a non-mandrel transition region plug 164. The transition region plug is the remaining portion of the gapfill layer 162 that was used to fill the transition region opening 141C.

Additionally, a non-mandrel line plug 180 has been formed by the preserved portion of the gapfill layer 162, which was covered by pillar 176D. It is important to note that the non-mandrel line plug 180 is self-aligned between mandrel spacers 158. Moreover, a non-mandrel ANA region plug 182 has been formed by the preserved portion of the gapfill layer 162, which was covered by pillar 176E.

Finally, the mandrel cut plugs 156 have also been preserved. This is due to the selectivity of the etching process to the spacer material.

Figure 15A:
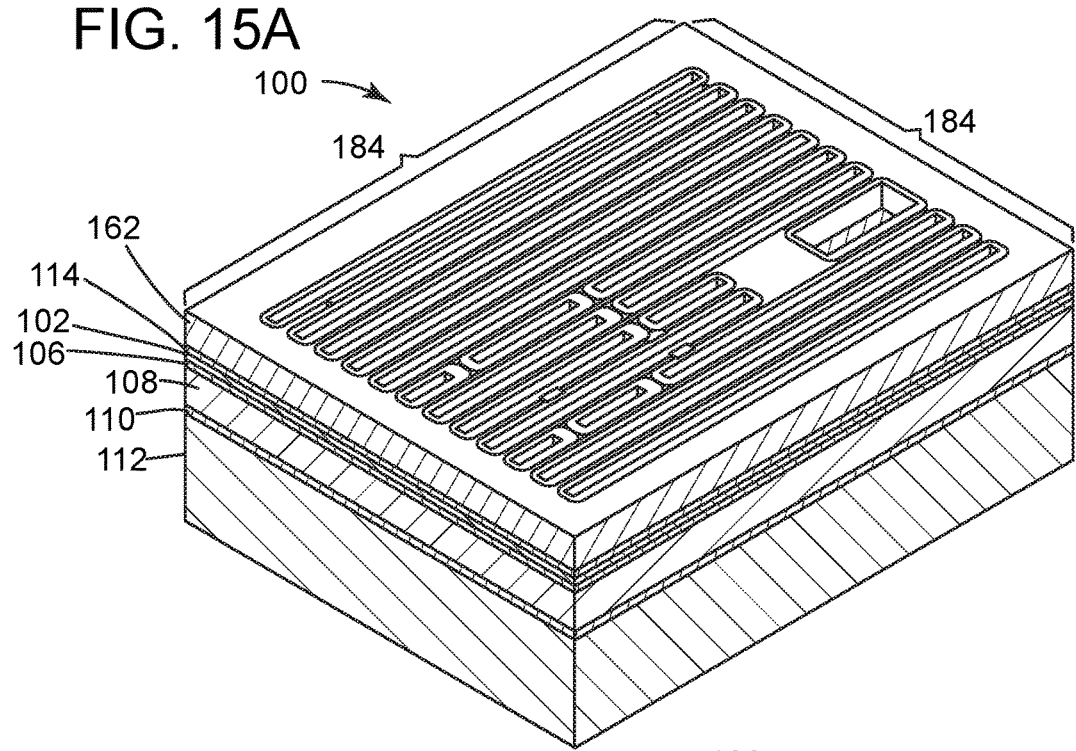
FIG. 15A is a perspective view of FIG. 14 having the mandrels removed to form a metallization pattern in accordance with the present invention.
Figure 15B:
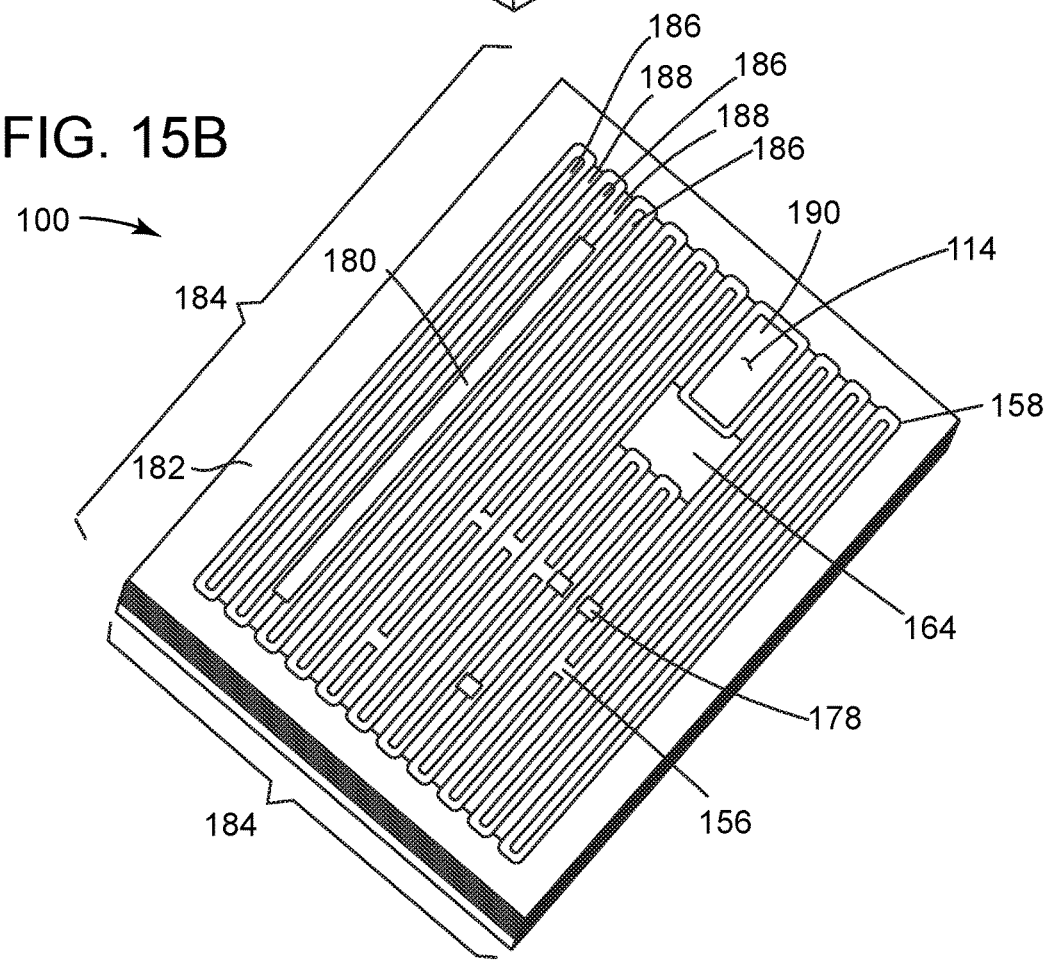
FIG. 15B is a top view of FIG. 15A in accordance with the present invention.

Referring to FIGS. 15A and 15B, wherein both perspective (FIG. 15A) and top (FIG. 15B) views of FIG. 14 after the mandrels 130 (including the wide mandrel section 138) have been removed (i.e., pulled) are presented. The material of the mandrels 130 may be removed by a well-known wet etch process or similar. Where the mandrels 130 have been removed, the $2^{nd}$ hardmask layer 114 is exposed.

With the removal of the mandrels 130 a metallization pattern 184 emerges. The pattern 184 includes the non-mandrel plugs 178, 164, 180 and 182. The pattern 184 will be utilized to form an array 194 of alternating mandrel 196 and non-mandrel 198 metal interconnection lines in the dielectric stack 104.

As will be explained in greater detail herein, the array 194 will include non-mandrel dielectric structures formed from the non-mandrel plugs 178, 164, 180 and 182. In this exemplary embodiment the non-mandrel dielectric structures include minimum sized non-mandrel continuity cuts 212, a non-mandrel dielectric transition region 218, a non-mandrel dielectric line region and a non-mandrel ANA region 222 (best seen in FIG. 18).

More specifically the pattern includes:

An array of alternating mandrel and non-mandrel line trenches 186 and 188 respectively. The mandrel line trenches 186 being formed when the mandrels 130 were pulled. The non-mandrel line trenches 188 being formed during the anisotropic etching process of FIG. 13.

A wide mandrel line trench 190, which was formed when the wide mandrel section 138 was pulled.

The mandrel spacers 158, which separate and define the trenches 186, 188 and 190.

Figure 18:
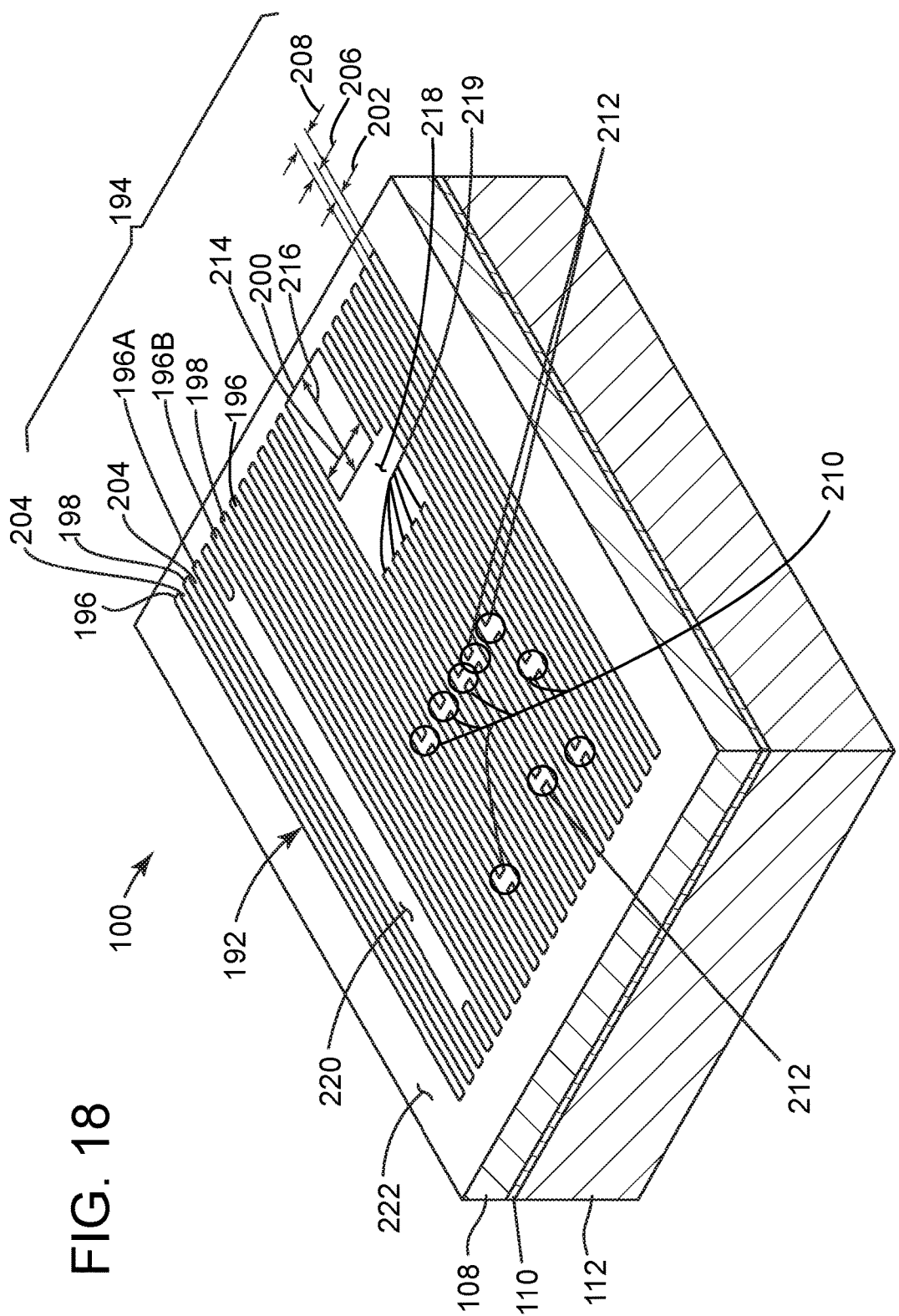
FIG. 18 is a perspective view of FIG. 17 having the pattern metalized within the ULK layer to form an array of interconnection metal lines in accordance with the present invention.

The mandrel cut plugs 156, which will be used to form minimum sized mandrel continuity cuts 210 in mandrel metal lines 196 (best seen in FIG. 18).

The non-mandrel cut plugs 178, which will be used to form minimum sized non-mandrel continuity cuts 212 in non-mandrel metal lines 198 (best seen in FIG. 18).

The non-mandrel transition region plug 164, which will be used to form a dielectric transition region 218 between minimum sized metal lines and a wide mandrel metal line 200 (best seen in FIG. 18) formed in the wide mandrel line trench 190.

The non-mandrel line plug 180, which will be used to form a non-mandrel dielectric line region 220 used to prevent the formation of a non-mandrel line in an array 194 of metal lines (best seen in FIG. 18).

The ANA plug 182, which will be used to form an ANA region 222 bordering the array 194 of metal lines (best seen in FIG. 18)

Figure 16A:
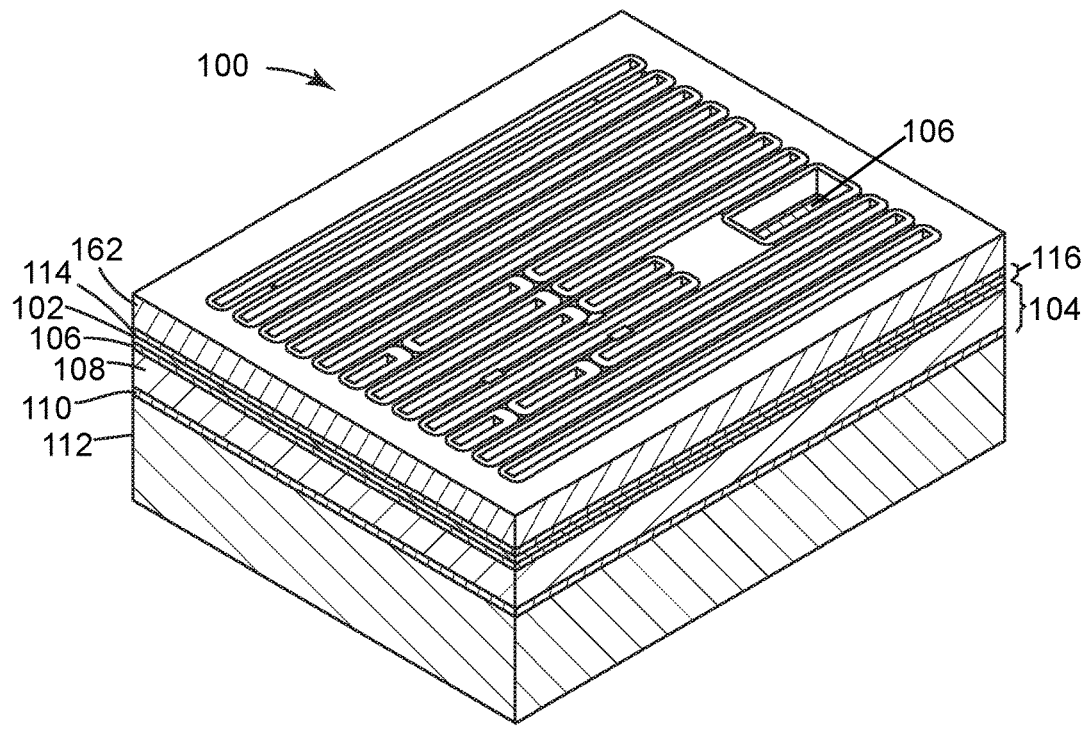
FIG. 16A is a perspective view of FIG. 15A having the $1^{st}$ and $2^{nd}$ hardmasks etched through to transfer the pattern onto the dielectric stack through in accordance with the present invention.
Figure 16B:
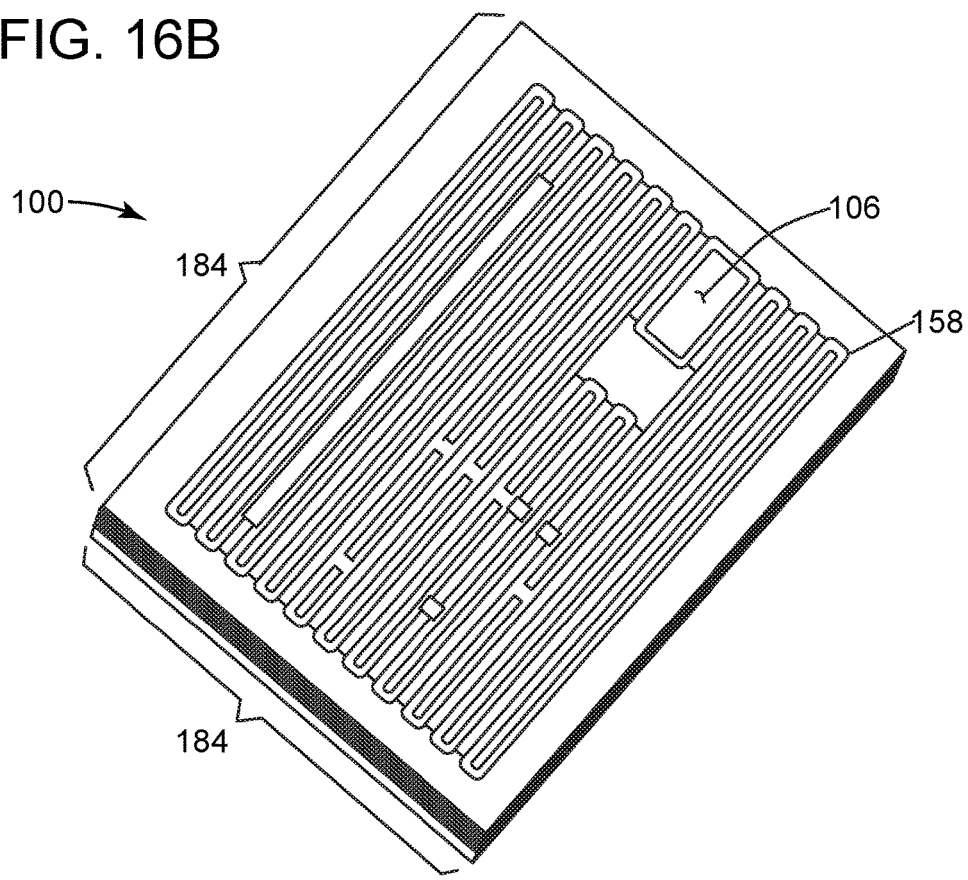
FIG. 16B is a top view of FIG. 16A in accordance with the present invention.

Referring to FIGS. 16A and 16B, wherein both perspective (FIG. 16A) and top (FIG. 16B) views of FIG. 15A after the $1^{st}$ and $2^{nd}$ hardmasks 102, 114 of hardmask stack 116 have been etched through is presented. Next during the process flow, the hardmask stack 116 is punched or etched through. This can be done with a selective RIE process which changes etching chemistry to first anisotropically etch the SiN $2^{nd}$ hardmask layer 114 and then anisotropically etch the TiN $1^{st}$ hardmask layer 102. At this point in the process flow, the pattern 184 has been transferred down to the top of the dielectric stack 104, which in this case means exposing the intermediate dielectric layer 106.

Figure 17:
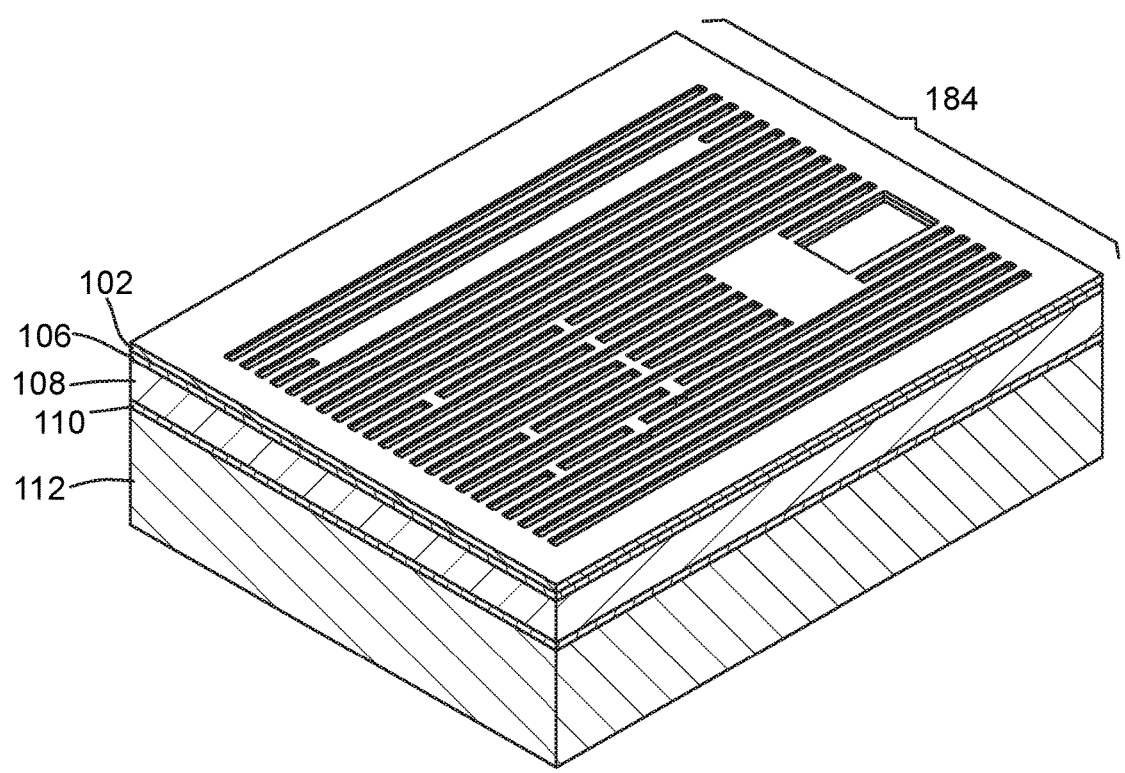
FIG. 17 is a perspective view of FIG. 16A having the pattern etched into the ULK layer of the dielectric stack and the spacers and gapfill layer removed in accordance with the present invention.

Referring to FIG. 17, the pattern 184 is etched into the ULK layer 108. Additionally, the mandrel spacers 158 and gapfill layer 162 are removed to reveal the pattern in the TiN $1^{st}$ hardmask layer 102.

More specifically, the final trenches, i.e., the mandrel line trenches 186, non-mandrel line trenches 188 and wide mandrel line trench 190 are etched through the intermediate dielectric layer 106 and into the ULK layer 108. This can be done by switching the RIE chemistry for each dielectric layer 106 and 108 in the dielectric stack 104. At the same time, the material of the mandrel spacers 158 and gapfill layer 162 are also etched away in this process.

However, the selectivity of the TiN $1^{st}$ hardmask layer 102 is such that there is still a TiN $1^{st}$ hardmask layer left once the trenches are fully formed into the ULK layer 106, and both the spacers 158 and gapfill layer 162 are removed. Accordingly, the pattern 184 is preserved in the $1^{st}$ hardmask layer 102 prior to metallization.

Referring to FIG. 18, the $1^{st}$ hardmask layer 102 and intermediate dielectric layer 106 are next removed. This can be done by a wet or dry etching process, ashing process or similar.

Next during the process flow, the structure 100 is metalized. That is, a metal layer 192 is next disposed over structure 100 to fill the trenches 186, 188 and 190 in the ULK layer 108. This can be done by PVD, CVD or electroless metal plating or similar. The metal layer 192 may be composed of tungsten, copper, cobalt, ruthenium or similar.

The metal layer 192 is next planarized down to finalize the formation of an array 194 of interconnection metal lines in the ULK layer 108 of the structure 100. This may be done by chemical mechanical polishing or similar. The array 194 of interconnection lines will become a portion of an interconnection system for an integrated circuit of which structure 100 is a part of.

As can be seen, the array 194 now includes alternating mandrel metal lines 196 disposed in the mandrel line trenches 186 and non-mandrel metal lines 198 disposed in the non-mandrel line trenches 188. The mandrel and non-mandrel metal lines 196, 198 are sized for a minimum metal line width 202 required for this application, which in this embodiment is set at 20 nm. These metal lines 196, 198 may be used to carry electrical signals or other similar functions.

The metal lines 196, 198 are separated by dielectric line spacers 204 formed from the mandrel spacers 158 of pattern 184. The dielectric line spacers 204 have a minimum dielectric spacer width 206, which in this embodiment is also set at 20 nm.

The combined minimum metal line width 202 and minimum dielectric spacer width 206 for a minimum metal line pitch 208. The minimum pitch, in this embodiment is therefore 40 nm. Significantly, this pitch 208 of 40 nm is smaller than most conventional lithographic processes can reliably achieve.

Additionally, the array 194 includes a plurality of minimum sized mandrel continuity cuts (or blocks) 210 disposed into the mandrel metal lines 196 and minimum sized non-mandrel continuity cuts 212 disposed into the non-mandrel lines 198. The mandrel continuity cuts 210 were formed from the mandrel cut plugs 156 of pattern 184. The non-mandrel continuity cuts 212 were formed from the non-mandrel cut plugs 178 of pattern 184. Significantly, the cuts 210, 212 are self-aligned with the edges of the metal lines 196, 198 and, therefore, do not extend into or clip adjacent metal lines. For this embodiment, the minimum width in the X direction and the minimum length in the Y direction of the continuity cuts 210, 212 is set at 20 nm.

Additionally, the array 194 includes a wide mandrel metal line 200 disposed in the wide mandrel line trench 190. The wide mandrel metal line 200 has a width 214 that is larger than the minimum metal line width 202 in the X direction and a length 216 that is larger than twice the minimum dielectric spacer width 206 in the Y direction. More preferably, the wide mandrel metal line 200 has a width 214 that is equal to or greater than two minimum metal line pitches, and a length 216 that is greater than or equal to four minimum metal line pitches. The wide mandrel metal line 200 may be used to carry electrical power or other similar functions.

Additionally, the array 194 includes a dielectric transition region 218. The dielectric transition region is disposed adjacent the wide mandrel metal line 200 in the Y direction such that it is between the wide mandrel metal line 200 and tip ends 219 of a plurality of minimum width mandrel and non-mandrel metal lines 196, 198. The dielectric transition region 218 was formed from the transition region plug 164 of pattern 184 and provides a precise transition region of dielectric material between the tip ends of the minimum width mandrel and non-mandrel lines 196, 198 and the end of the wide mandrel metal line 200.

Significantly, the array 194 also includes a non-mandrel dielectric line region 220 disposed between two adjacent mandrel metal lines 196 A and 196B. The non-mandrel dielectric line region 220 is self-aligned with the adjacent mandrel lines 196A and 196B and was formed from the non-mandrel line plug 180 of pattern 184.

The non-mandrel dielectric line region 220 has a width in the X direction that is substantially equal to the minimum metal line width plus two minimum dielectric spacer widths combined. The non-mandrel dielectric line region can have any length, including, but not limited to, having a length that is greater than or equal to 1 minimum metal line pitch, 3 minimum metal line pitches, 5 minimum metal line pitches, 10 minimum metal line pitches or more.

The non-mandrel dielectric line region 220 was utilized to prevent the formation of a non-mandrel metal dummy line between the mandrel lines 196A and 196B. By blocking formation of a dummy line, the non-mandrel dielectric line region 220 reduces the parasitic capacitance between the adjacent mandrel lines 196A and 196B, and, therefore, improves performance. Prior to this invention, the prevention (or blocking) of formation of dummy lines from between active lines in arrays of metal lines having pitches of 80 nm or less, and more preferably 40 nm or less, was very problematic in conventional prior art methods of fabrication.

Additionally, the array 194 includes a large ANA region 222 disposed around the perimeter of the mandrel and non-mandrel lines 196, 198. The ANA region 222 was formed from the ANA plug 182 of pattern 184. The ANA region is a relatively large feature that extends in both the X and Y directions for many minimum pitch lengths. The ANA region defines the border of the entire array 194 and is a dielectric region where no metal lines are disposed.

Although the invention has been described by reference to specific embodiments, it should be understood that numerous changes may be made within the spirit and scope of the inventive concepts described. Accordingly, it is intended that the invention not be limited to the described embodiments, but that it have the full scope defined by the language of the following claims.

What is claimed is:

1. A method comprising:
   providing a semiconductor structure having a dielectric stack, hardmask stack, and mandrel layer disposed thereon;
   patterning an array of mandrels into the mandrel layer such that the array of mandrels includes:
   a plurality of minimum width mandrels having a minimum width and a minimum mandrel pitch, and
   a wide mandrel section having a width and a length that are at least equal to two minimum mandrel pitches;
   patterning a plurality of mandrel openings into the array of mandrels, the mandrel openings having at least a minimum opening width and having a minimum opening length required to provide a minimum mandrel continuity cut through a mandrel metal line having a minimum metal line width;
   patterning a transition region opening into the array of mandrels, the transition region opening having a width and a length that are at least equal to two minimum mandrel pitches, the transition region opening being disposed between, and adjacent to, the wide mandrel section and at least two minimum width mandrels;
   forming mandrel spacers self-aligned on sidewalls of the mandrels;

disposing and planarizing a gapfill layer over the semiconductor structure;

forming non-mandrel pillars over the planarized gapfill layer;

etching exposed portions of the gapfill layer to form non-mandrel plugs preserved by the pillars;

removing the pillars to form a pattern, the pattern including the non-mandrel plugs; and utilizing the pattern to form an array of alternating mandrel and non-mandrel metal interconnection lines in the dielectric stack, the array including non-mandrel dielectric structures formed from the non-mandrel plugs.

2. The method of claim 1 comprising:

the pattern including a non-mandrel line plug preserved by a pillar; and forming a non-mandrel dielectric line region from the non-mandrel line plug, the non-mandrel dielectric line region being disposed between, and self-aligned with, two adjacent mandrel metal lines of the pattern.

3. The method of claim 1 comprising:

the pattern including a non-mandrel ANA region plug;

forming a non-mandrel dielectric ANA region from the non-mandrel ANA region plug.

4. The method of claim 1 comprising:

the pattern including a non-mandrel cut plug;

forming a non-mandrel dielectric continuity cut from the non-mandrel cut plug, the non-mandrel dielectric continuity cut being disposed within a non-mandrel metal line of the pattern.

5. The method of claim 1 comprising:

the pattern including a non-mandrel transition region plug;

forming a non-mandrel dielectric transition region from the non-mandrel transition region plug, the non-mandrel dielectric transition region being disposed between tip ends of a plurality of mandrel and non-mandrel metal lines having a minimum width and a wide mandrel metal line having a width that is larger than the minimum width.

6. The method of claim 1 wherein the array of mandrel and non-mandrel metal lines have a minimum pitch that is equal to or less than one of 80 nm and 40 nm.

7. The method of claim 1 wherein the dielectric stack includes an ultra-low k (ULK) layer, and the array of metal interconnection lines is disposed in the ULK layer.

8. The method of claim 1 comprising disposing a spacer layer over the array of mandrels, the spacer layer having a predetermined spacer layer thickness that is greater than or equal to half the minimum opening length of a mandrel opening, wherein the spacer layer fills the plurality of mandrel openings to form a plurality of mandrel cut plugs and does not fill the transition region opening.

9. The method of claim 8 comprising etching the spacer layer to form the mandrel spacers.

10. The method of claim 9 comprising:

filling the transition region opening with the gapfill layer;

forming a non-mandrel pillar over the filled transition region opening;

etching exposed portions of the gapfill layer to form a non-mandrel transition region plug preserved by the non-mandrel pillar over the filled transition region opening;

forming a non-mandrel dielectric transition region within the array of metal interconnections lines from the non-mandrel transition region plug; and forming mandrel continuity cuts within the mandrel metal lines of the array of metal interconnection lines from the mandrel cut plugs.

* * * * *